United States Patent [19]

Coffin

[11] Patent Number: 4,643,501

[45] Date of Patent: Feb. 17, 1987

[54] ELECTRONIC BOARD FIXTURE

[76] Inventor: Harry S. Coffin, 424 Weadley Rd., King of Prussia, Pa. 19406

[21] Appl. No.: 656,648

[22] Filed: Oct. 1, 1984

[51] Int. Cl.<sup>4</sup> ............................................. H01R 9/09
[52] U.S. Cl. ................................. 339/35; 339/75 M; 339/117 P; 339/255 R
[58] Field of Search ............ 339/75 M, 255 R, 117 P, 339/34, 35; 324/158 F, 73 PC

[56] References Cited

U.S. PATENT DOCUMENTS

| | | | |
|---|---|---|---|
| 4,344,033 | 8/1982 | Stowers et al. | 339/117 P |
| 4,357,062 | 11/1982 | Everett | 324/158 F |
| 4,357,575 | 11/1982 | Uren et al. | 324/73 PC |

Primary Examiner—John McQuade
Attorney, Agent, or Firm—Frederick J. Olsson

[57] ABSTRACT

A fixture to support an electronic board and to be connected to a tester for testing the electronic board. The fixture has a fixed support, a vertically movable first carrier on the fixed support mounting an electronic board, a vacuum chamber for moving the first carrier, spring means for vertically moving the first carrier away from the fixed support, a second carrier mounted on the first carrier for vertical motion, a vacuum chamber for moving the second carrier relative to the first carrier downwardly toward the fixed support, and spring means connected between said first and second carriers for moving the second carrier relative to the first carrier upwardly away from the fixed support.

5 Claims, 5 Drawing Figures

ELECTRONIC BOARD FIXTURE

This invention relates to functional and fault testing of electronic boards such as printed circuit boards and wire wrapped boards and more particularly relates to probe-type electronic board fixture means for supporting such boards on a tester.

One object of the invention is to provide electronic board fixture means having an improved basic structure which permits the fixture for use in:

(a) supporting wire wrapped boards with the connector pins extending downwardly and contacted by probes functioning from the bottom side of the board;

supporting wire wrapped boards with the connector pins extending upwardly and contacted by probes functioning from the top side of the board;

(c) supporting printed circuit boards having top mounted components, the leads of the components being contacted by probes functioning from the top side of the board;

(d) supporting printed circuit boards having both top and bottom mounted components, the leads of both the top and bottom components being simultaneously contacted by probes functioning respectively from the top side and the bottom side of the board;

(e) supporting wire wrapped boards or printed circuit boards with a set of edge connectors on the top side of the board, the edge connectors being contacted by probes functioning from the top side of the board; and (f) supporting wire wrapped or printed circuit boards with a set of edge connectors on the top side and a set of edge connectors on the bottom side of the board, the sets being simultaneously contacted by probes functioning respectively from the top side and the bottom side of the board.

Another object of the invention is to provide a fixture of the kind in question structured to permit the engagement of the desired board item by probes functioning from the top side of the board under test or from the bottom side of the board or functioning simultaneously from both the top and bottom sides of the board.

Another object of the invention is to provide a fixture of the kind in question structured to permit operation irrespective of the resistance pressure of the probes, i.e. for testing high density wirewrap boards. Another object of the invention is to provide a fixture wherein the movable probes move in a vertical direction along a straight line, the latter motion permitting probe contact with the leads of the top mounted components and permitting probe contact with the top mounted edge connectors, the aforesaid probe contact being a point contact rather than a line contact to thereby eliminate scraping off the gold on the edge connectors.

A typical embodiment of the invention will be described below in connection with the following drawing wherein.

Figure 1:
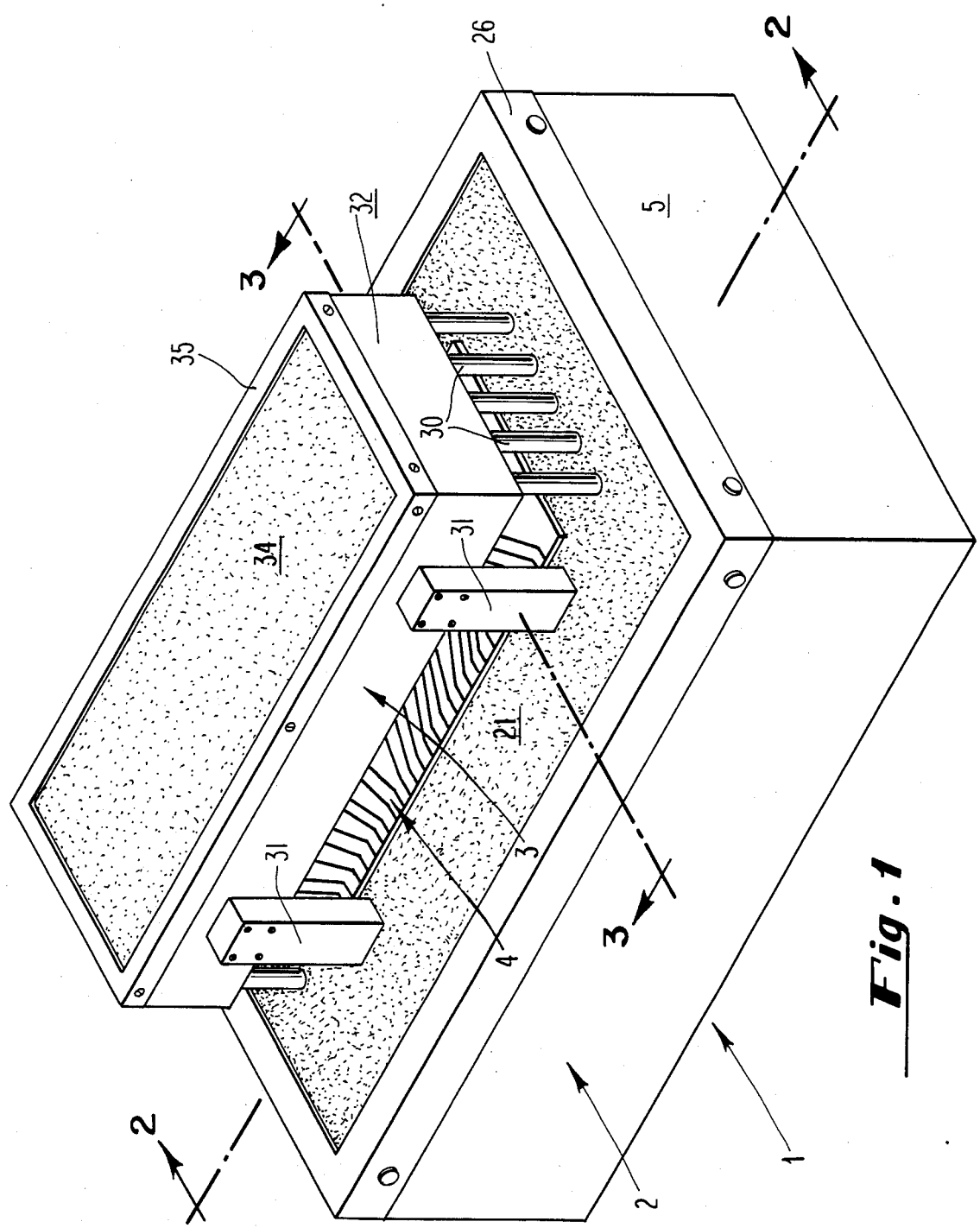
FIG. 1 is a perspective view of the improved electronic board fixture of the invention.

In the fixture 1 of FIG. 1 a fixed generally rectangular shaped support or frame is indicated at 2, a vertically movable first carrier means is indicated at 3, and a board to be supported with items on the board to be electrically interconnected is indicated at 4. A second carrier means not shown is mounted inside the first carrier means 3, as noted in FIG. 2, the board 4 is of the wire-wrap type having pins 4a extending vertically downwardly from the bottom side of the board. The fixture 1 is portable for purposes of placing on a tester to test the board mounted in the fixture.

The frame or fixed support 2 has a vertical side 5, bottom 6, and top 7. The bottom 6 is an interface pad conventionally used with board fixtures. The pad has electrical connectors to electrically interconnect the board fixture 1 to the tester (not shown). Conventionally, the pad comprises a plurality of pins and for descriptive purposes I have shown a single pin 10 which has an exterior head 11, an interior shank 12, and which is wire-wrapped at 13.

The top 7 mounts a plurality of spring loaded probes 14 which are conventionally used with board fixtures. The probe 14 has a lead wire 15. These lead wires are appropriately connected to the wires 13 of the pins 10. The casing or housing of each probe 14 makes a friction fit with the top 7 and the bottom of the case is seated. Each pin is mounted so that its axis extends in a vertical direction. In connection with the probe 14, I might mention here that although the force to overcome the spring pressure of an individual probe is small, conventional board fixtures cannot set up wire-wrap type boards for testing where pin density is more than approximately 30 pins per square inch. With the present invention, probe density can far exceed the foregoing as will appear later.

The first carrier means 3 includes a flat bottom plate 16 disposed above the top 7 and having openings 17 for accomodating the heads of the probes 14 and the pins 4a of the board. A plurality of control compression springs 20 are disposed between the top 7 and the underside of the plate 16. On the top side of the plate 16 is a rubber diaphram 21 having a center aperture 22. The diaphram is connected to the fixed support as noted following. The outer periphery 23 of the diaphram is molded to form a socket 24 within which is annular, inner spacer 25. The annular L-shaped bracket 26 bears down on the diaphram pressing the same tight against the spacer 25 which in turn bears down on the diaphram pressing the same on the top 7.

On the top side of the bottom plate 16 are disposed a plurality of supports 27. The fixed support mounts the board 4 by that the peripheral edge of same rests on the inner edge of the diaphram 21 and the central part rests on the supports 27. Further, in connection with the structure of the first carrier means 3, the bottom plate 16 mounts a plurality of vertically extending standards 30 (FIG. 2) and also mounts pair of vacuum ports 31 (FIG. 3). Both the standards and the vacuum ports are screw connected to the plate 16. The standards 30 and the vacuum ports 31 are connected to the side 32 of the first carrier 3.

Mounted on the bottom edge of the side 32 is an intermediate plate 33 and on the top edge of the side 32 is a rubber diaphram 34. The intermediate plate 33 is held in place by screws and the diaphram held in place by the annular frame 35.

A second carrier 40 is mounted on the first carrier. The second carrier 40 comprises a top plate 41, push rods 42, and mounting plate 43. The push rods 42 extend through openings in the intermediate plate 33. Compression springs 44 operate between the top plate 41 and the intermediate plate 33. In the embodiment shown, the mounting plate 43 carries a resilient pad 45 for engaging the top surface of the board 4. As will be apparent later, the shape of the mounting plate may be in a different form and may carry probes instead of the pad.

The push rods 42 are connected to the top plate 41 and to the mounting plate by screws as shown. The openings in the interme-diate plate 33 are proved with air seals such as seals 46 which allow the rods to move but restrict the passage of air through the openings. The first carrier 3 and the second carrier 40 are set up for straight line motion in a vertical direction. This is accomplished as follows.

With respect to the first carrier 3 note that the peripheral edge 16a of the plate 16 extends into the socket 24 and engages the spacer 25. The engaged surface 25a of the spacer 25 is planar and vertical. This planar surface 25a and the planar surface 16a make a snug but sliding fit. Thus, these planar surfaces function as a guide to direct vertical motion of the plate 16 (hence the first carrier 3) along an axis which is straight and vertical. Note in FIG. 2 that the inner edge of the frame 26 overhangs the edge 16a of the plate and holds the carrier 3 against the force of spring 2 and thus, establishes the topmost position of the carrier 3.

With respect to the second carrier means 40 it will be apparent that the action of the push rods 42 in the opening/seals 46 function as guides to direct vertical, straight-line motion of the second carrier.

The motion of the first and second carriers 3 and 40 is controlled by vacuum chambers and by the springs 20 and 41. The vacuum/spring control for the first carrier 3 will now be explained.

Figure 2:
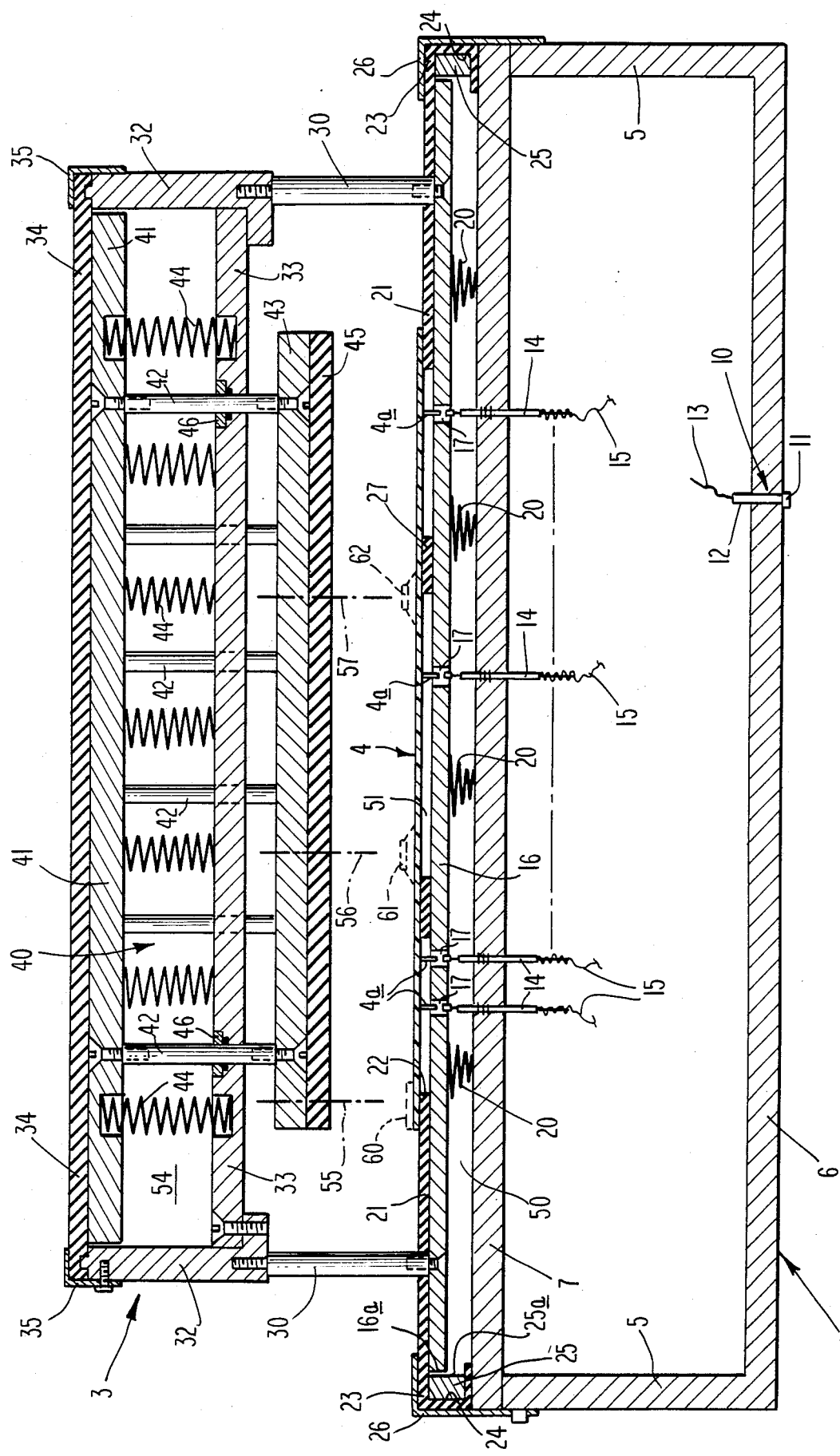
FIG. 2 is an enlarged sectional elevational view taken along the lines 2—2 of FIG. 1.
Figure 3:
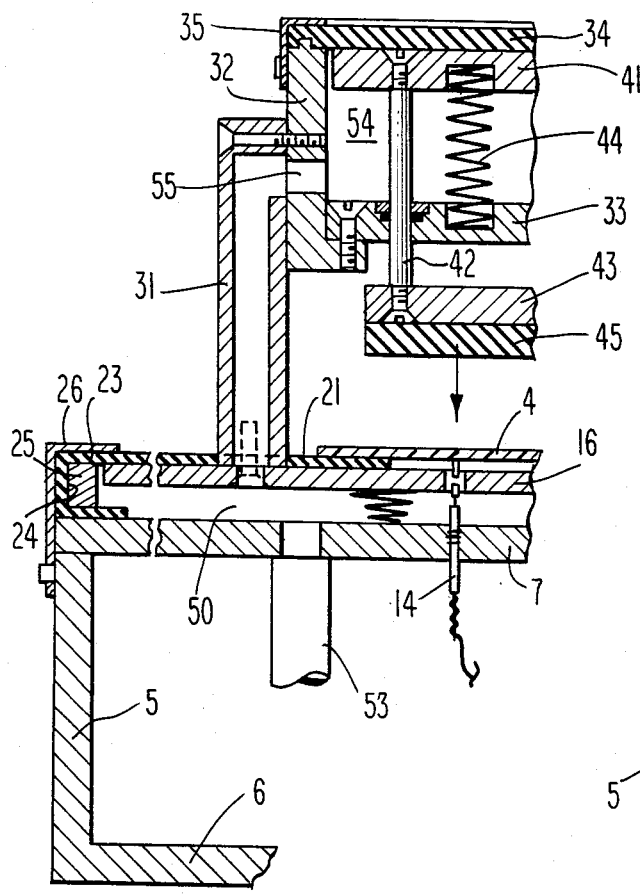
FIG. 3 is an enlarged sectional fragmented elevational view taken along the lines 3—3 of FIG. 1 and illustrating positions of certain components in the "up" position.

Referring to FIG. 2, the top 7, the bottom plate 16, the peripheral arrangement of the diaphram 21 provide for a vacuum chamber 50. This chamber 50 is open to the space 51 just below the board 4 via the openings 17 in board 16 for accomodating the probes 14 and pins 4a. However, boards of the kind mentioned do not have any openings. Thus, when chamber 50 is evacuated the peripheral edge of the board 4 will be sucked down against the diaphram and the integrity of the chamber 50 maintained. It will be apparent that when the chamber 50 is evacuated the atmospheric pressure on the diaphram 21 and on board 4 will cause the first carrier 3 to move down against the force of springs 20.

The chamber 50 is connected to a vacuum pump on the tester (not shown) via the hose 53.

The vacuum/spring control for the second carrier 40 will now be described.

Referring to FIG. 2, it will be seen that the intermediate plate 33, the side 32, and the diaphram 34 of the carrier 40 form a vacuum chamber 54.

The chamber 54 is open to the ports 31 via openings 55 in the side 32. When the chamber 54 is evacuated, the atmospheric pressure on the diaphram 34 causes the same to exert a downward force on the top plate 41 and which moves the second carrier 40 downwardly against the force of springs 44. When the vacuum is removed the springs force the second carrier upwardly to the position shown in FIG. 2. The hose 53 has an end connector (not shown) by which it is connected to the vacuum system in the tester. These systems are conventional and have a control arrangement so that the vacuum can be worked as desired. For example, in the present case to cause the same to create a vacuum in chambers 50 and 54 as described, to hold the vacuum for the board test phase, then to vent or discontinue the vacuum after the test. Conventional systems are set up for automatic or manual operation.

With the above in mind the operation of the fixture with a board such as the board 4 will now be described.

First, assume that the chambers 50 and 54 are at atmospheric pressure and the springs 20 and 44 have moved the first and second carrier to the positions shown in FIG. 1 and that the board 4 has been placed on the diaphram 21 as shown.

Figure 4:
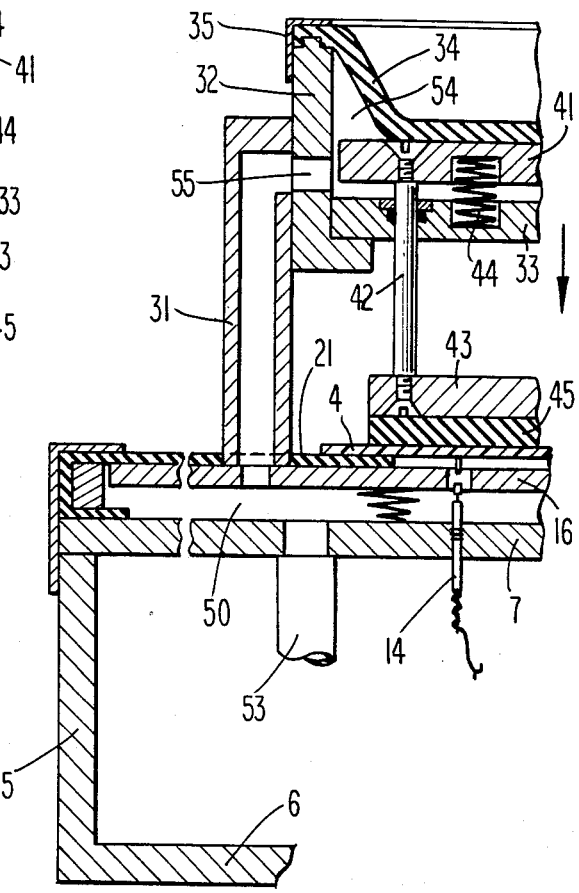
FIG. 4 is a view of the components of FIG. 3 in the "board engagement" position.
Figure 5:
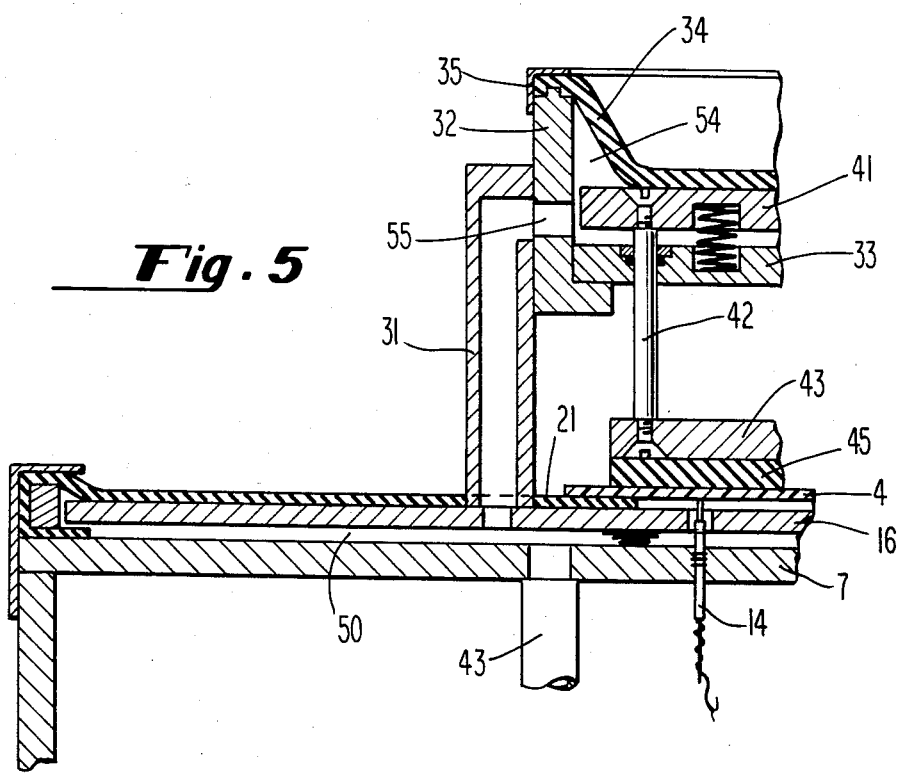
FIG. 5 is a view of the components of FIG. 4 in the "lower" position.

The composite cross sectional area of the diaphram 21 and board 4, the cross sectional area of the diaphram 34, the spring constants of the springs 20 and 44 are respectively chosen so that when the chambers 50 and 54 are connected to the vacuum pump, the second carrier 40 moves down while the first carrier 3 remains stationary until the pad 45 engages the board 4 and presses the peripheral edge firm against the diaphram 21 (FIG. 4). This creates additional force on the first carrier and causes the same to move down against the force of springs 20 so that the pins 4a engage the heads of the probes 14 and then continue on down against the force of the springs in the probes to establish a firm positive engagement between pins and probe heads.

When the board testing is completed, the vacuum is discontinued, the board 4 removed, and another board inserted for testing.

The ability of the fixture to impose a hold down force on the board prior to the engagement between pins and probes is very important. The hold down force is made great enough to overcome the force generated by the springs in the probes. This provides for the board 4 to remain tight against the diaphram 21 and, therefore, hold the vacuum while at the same time allowing for downward movement to establish the desired engagement between probes 14 and pins 4a.

Thus, boards with a very high probe density can be set up in the fixture for testing which was impossible heretofore. For example, conventional testers are limited to probe densities in the order of 30 pins per square inch whereas the fixture of the invention permits testing of boards where densities are in the order or 100 pins per square inch.

The foregoing fixture is readily adaptable for setting up boards for tests where the board is placed in the fixture with the items on the top side. In such instances the resilient pad 45 is not employed and probes such as the probe 14 are mounted on the mounting plate respectively in positions to contact the items. Also, the vacuum system on the tester is manipulated so that only the second carrier moves toward and away from the fixed support. Thus, in FIG. 2 I have indicated top probes on the mounting plate by the dot-dash lines 55, 56, and 57. On the board, the dotted item indicated at 60 represents a top mounted edge connector and the dotted items indicated at 61 and 62 represent top mounted components. Note that the probes 55, 56, and 57 are respectively aligned with these items.

Naturally, the number of probes and the number of edge connectors and components will depend on the design of the board. Also, the flat shape of the mounting plate 43 may be changed to accomodate the different height of components.

With the above arrangement, the vacuum system is energized to evacuate the vacuum chambers and cause the mounting plate 43 to move down so that the probes engage the edge connectors and/or the leads of the items. The vacuum system is then put on hold. Since there is no probe force on the bottom of the board, the force exerted by the top probes is sufficient to maintain the board in position. After the test, the vacuum is removed to cause the probes to disengage.

It will be apparent that with the top probes moving in a vertical direction, each head of each probe engages its edge connector in point contact mode and not a line contact mode. There is no scraping as between a probe and the edge connector surface metal. The latter, usually gold, is not disturbed.

Further, it is pointed out that the fixture is adapted for setting up boards for tests where the board has items such as edge connectors and components on both the top and bottom sides. In such instances the spring constants and the vacuum generated forces are coordinated so that the second carrier moves to bring down the top probes into engagement with items and after this engagement is established, both carriers are moved down to bring the bottom items into engagement with the bottom probes.

It will be understood, of course, that in the top side and top/bottom side arrangement just described, the dimension and shape of fixture parts will be made compatible with the board design.

I claim:

1. In fixture means arranged to support a wire-wrap board having a high density set of pins on at least one side thereof with each pin being in an upstanding accessible position and also arranged to make electrical interconnections between pins of said set, the fixture being for use in being connected in a tester for testing the board:
    fixed support means;
    a plurality of spring-loaded probes mounted on said fixed support means with the axis of each probe extending in a vertical direction;
    first carrier means disposed above said probes and mounted on said fixed support means for straight-line vertical motion toward and away from said fixed support means;
    means on said first carrier means for mounting said wire-wrap board in a horizontal orientation with the pins of said set extending downwardly toward said probes;
    second carrier means mounted on said first carrier means for movement therewith and for movement relative thereto in straightline vertical motion;
    mounting plate means including resilient pad means mounted on said second carrier means for movement therewith and disposed so that the resilient pad is above the wire-wrap board mounted on said fixed support means for engaging the board; and
    means operating said first and second carrier means as follows: moving the second carrier means relative to the first carrier means so that the resilient pad engages and secures the board on the first carrier means, then moving the first and second carriers simultaneously so that pins of said set engage probes and maintaining said engagement for testing of the board and thereafter moving said first and second carriers so that said pin and said probes disengage.

2. In fixture means arranged to support a printed circuit board with a top set of components and leads thereof and a top set of edge connectors on the top side of the board and a bottom set of components and leads thereof and a bottom set of edge components on the bottom side of the board, the respective leads and edge connectors being upstanding and accessible and the fixture means also being arranged to make electrical interconnection between components of said sets and connectors of said sets, the fixture being for use in being connected in a tester for testing the printed circuit board:
    fixed support means;
    a plurality of bottom spring-loaded probes mounted on said fixed support means with the axis of each probe extending in a vertical direction;
    first carrier means disposed above said bottom probes and mounted on said fixed support means for straight-line vertical motion toward and away from said fixed support means;
    means on said first carrier means for mounting said printed circuit board in a horizontal orientation;
    second carrier means mounted on said first carrier means for movement therewith and for movement relative thereto in a straight-line vertical motion;
    mounting plate means mounted on said second carrier means for movement therewith and disposed above a printed circuit board mounted on said fixed support means;
    a plurality of top spring-loaded probes mounted in said mounting plate means with the axis of each probe extending in a vertical direction; and
    means operating said first and second carrier means as follows: moving the second carrier means relative to the first carrier means so that the top probes engage leads of said top set and edge connectors of said top set, then moving said first and second carriers simultaneously so that leads of said bottom set and edge connectors of said bottom set engage said bottom probes and maintaining said engagements for testing of the board and thereafter moving said first and second carriers to break said engagements.

3. Fixture means to support an electronic board and to be connected to a tester for testing the electronic board, the fixture comprising:
    fixed support means;
    first carrier means mounted on said fixed support means for vertical motion toward and away from said fixed support means;
    means including a first flexible diaphram exposed to the atmosphere forming a first vacuum chamber for moving said first carrier means toward said fixed support, the diaphram being for use in supporting said electronic board in a generally horizontal orientation;
    spring means connected between said first carrier means and said fixed support for moving said first carrier means away from said fixed support means;
    second carrier means mounted on said first carrier means for vertical motion toward and away from said fixed support means;
    means including a second flexible diaphram exposed to the atmosphere forming a vacuum chamber for moving said second carrier means relative to the first carrier means toward said first support means;
    a plurality of spring-loaded probes mounted on said second carrier means for engaging an electronic board on the first carrier means when the second carrier means moves toward said fixed support means;

spring means connected between said first and second carrier means for moving said second carrier means relative to said first carrier means in a direction away from said fixed support means; and means connecting said first and said second vacuum chambers to a vacuum pump for simultaneously evacuating the chambers.

4. Fixture means to support an electronic board and to be connected to a tester for testing the electronic board, the fixture comprising:

fixed support means;

first carrier means mounted on said fixed support means for vertical motion forward and away from said fixed support means;

means on said first carrier means for mounting an electronic board in a generally horizontal orientation;

means including a flexible diaphram exposed to the atmosphere forming a first vacuum chamber for moving said first carrier means downwardly toward said fixed support;

spring means connected between said first carrier means and said fixed support for moving said first carrier means upwardly away from said fixed support means;

second carrier means mounted on said first carrier means for vertical motion toward and away from said fixed support means;

means including a flexible diaphram exposed to the atmosphere forming a second vacuum chamber for moving said second carrier means relative to the first carrier means downwardly toward said fixed support means; and spring means connected between said first and second carrier means for moving said second carrier means relative to said first carrier means upwardly away from said fixed support means.

5. Fixture means to support an electronic board and to be connected to a tester for testing an electronic board having leads, the fixture comprising:

fixed support means;

a plurality of spring-loaded probes mounted on said fixed support means and extending upwardly therefrom;

first carrier means mounted on said fixed support means for vertical motion toward and away from said fixed support means and having a plurality of openings respectively permitting passage of said probes therethrough;

means including a first flexible diaphram exposed to the atmosphere forming a first vacuum chamber for moving said first carrier means toward said fixed support, the diaphram having means for supporting said electronic board in a generally horizontal orientation with said leads respectively over said openings and respectively vertically aligned with said probes;

spring means connected between said first carrier means and said fixed support for moving said first carrier means away from said fixed support means;

second carrier means mounted on said first carrier means for vertical motion toward and away from said fixed support means;

means including a second flexible diaphram exposed to the atmosphere forming a vacuum chamber for moving said second carrier means relative to the first carrier means toward said first support means;

spring means connected between said first and second carrier means for moving relative to said first carrier means in a direction away from said fixed support means;

means connecting said first and said second vacuum chambers to a vacuum pump for simultaneously evacuating the chambers; and arranging the composite cross-sectional areas of said first diaphram and an electronic board mounted thereon and arranging the cross-sectional area of said second diaphram and arranging the spring constants of said first and second springs so that when said first and second chambers are simultaneously evacuated the first and second carrier means move down until the electronic board is engaged by the second carrier and said probes are engaged by said leads, the engagement of the second carrier with the first carrier creating additional downward force on the first carrier to overcome probe pressure.

* * * * *